United States Patent [19]

Boysel

[11] Patent Number: 5,721,801
[45] Date of Patent: Feb. 24, 1998

[54] MEMBRANE OPTICAL WAVEGUIDE DEVICE AND METHOD OF FABRICATION

[75] Inventor: Robert M. Boysel, Pleasant Valley, N.Y.

[73] Assignee: Texas Instruments Incorporated, Dallas, Tex.

[21] Appl. No.: 768,367

[22] Filed: Dec. 17, 1996

[51] Int. Cl.⁶ .......................................... G02B 6/10
[52] U.S. Cl. .................. 385/130; 385/132; 385/131; 385/14
[58] Field of Search .................. 385/130, 14, 131, 385/132, 2, 8, 147; 359/900

[56] References Cited

U.S. PATENT DOCUMENTS

| | | | |
|---|---|---|---|
| 5,178,728 | 1/1993 | Boysel et al. | 216/13 |
| 5,199,088 | 3/1993 | Magel | 385/18 |
| 5,278,925 | 1/1994 | Boysel et al. | 385/14 |
| 5,404,412 | 4/1995 | Seino et al. | 385/2 |
| 5,418,883 | 5/1995 | Eda | 385/131 |
| 5,559,912 | 9/1996 | Agahi et al. | 385/42 |

*Primary Examiner*—John Ngo
*Attorney, Agent, or Firm*—Charles A. Brill; James C. Kesterson; Richard L. Donaldson

[57] ABSTRACT

A method of manufacturing an optical waveguide device. The method involves removing a portion of an upper cladding layer 110 from above a waveguide 106 and depositing a temporary spacer layer 114 in place of the removed upper cladding 110. A metal membrane 116 is deposited and patterned over the temporary spacer layer 114 and the temporary spacer 114 is removed, leaving the metal membrane 116 suspended over the waveguide 106. When a voltage differential is applied between the metal membrane 116 and electrodes 108 formed on a lower cladding 102, the metal membrane 116 is collapsed against the waveguide 106, attenuating any light transmitted by the waveguide 106.

11 Claims, 2 Drawing Sheets

MEMBRANE OPTICAL WAVEGUIDE DEVICE AND METHOD OF FABRICATION

FIELD OF THE INVENTION

This invention relates to the field of optical processing, more particularly to the fabrication of optical waveguide devices such as switches and attenuators.

BACKGROUND OF THE INVENTION

Optical fiber waveguides find many uses in communication systems because of their small size and extremely high bandwidth. Although the fibers themselves are very small and relatively inexpensive, the associated optical devices such as modulators, switches, and attenuators are difficult to produce cheaply enough to exploit fully the capability of fiber optics.

Much effort is being expended to develop methods of fabricating optical devices on semiconductor wafers, such as silicon or gallium arsenide, using standard semiconductor wafer fabrication processes. For example, silicon may be doped for form electronic devices which, due to resistive heating or the control of free carriers, modulate light passing through the device. If optical devices can be fabricated on semiconductor wafers using standard processes, the devices will be much easier to integrate with existing semiconductor waveguides, which will increase the number of practical applications of fiber optic devices.

SUMMARY OF THE INVENTION

One aspect of the present invention is a method of fabricating an optical waveguide device, such as a switch or attenuator, that uses a temporary spacing layer to support a metal membrane above a waveguide during the fabrication process. The temporary spacing layer is removed to allow the metal membrane to be deflected toward an electrode fabricated on a lower cladding. When deflected, the metal membrane defeats the total internal reflection of the waveguide, attenuating the light carried by the waveguide. The fabrication process produces a novel optical device that can easily be fabricated.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1A:
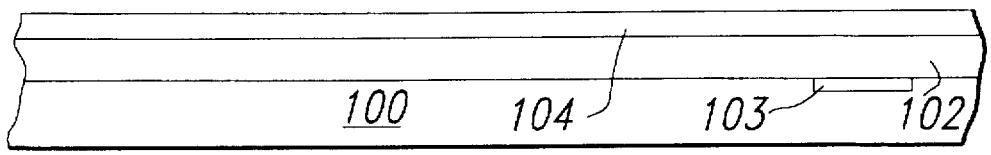
FIG. 1A is a cross section view of an optical device according to one embodiment of the present invention prior to the patterning of the waveguides on the lower cladding.

Optical waveguides operate by allowing light to pass freely through the inner core while being totally reflected by the interface between the inner core and the surrounding materials, called cladding. The ratio between the index of refraction of the inner core and the index of refraction of the cladding, determines the maximum angle at which the transmitted light will reflect totally when the light strikes the interface. The greater the angle, the more modes the wave guide will support and the greater the admittance angle to the fiber. A large admittance angle allows more tolerance when aligning the waveguide with adjacent optical devices.

Air is a suitable cladding, but does not prevent objects, such as adjacent optical fibers, from touching an optical fiber. If an adjacent optical fiber touches a first fiber, the adjacent fiber acts as the cladding for the first fiber and, because the cladding then has the same index of refraction as the first fiber, defeats the total internal reflection. To prevent nearby objects from defeating the internal reflection, other materials, such as doped glass, are used to prevent other objects or adjacent optical fibers from touching a fiber and defeating the total internal reflection.

Semiconductor waveguides may be formed using a two-piece oxide cladding surrounding an nitride inner core. Semiconductor waveguides are typically fabricated by first depositing a lower cladding of silicon dioxide, then depositing and patterning a silicon nitride waveguide on the lower cladding. Mother layer of oxide is then deposited over the nitride and lower cladding to form the upper cladding.

Some types of optical waveguide devices, as taught by U.S. Pat. No. 5,278,925, "Integrated-Optic Waveguide Devices and Method," issued Jan. 11, 1994, modulate the light transmitted by a waveguide by deflecting a metal membrane though an air gap to a position proximate to, or in contact with, the waveguide. The metal membrane alters the effective refractive index of the waveguide and attenuates the light transmitted by the waveguide. As the attenuation effect of the optical device is increased, the optical device acts like a switch to effectively block all of the light transmitted by the waveguide.

Ideally, a metal membrane can be formed on the planar surface of the upper cladding, and the upper cladding can be removed from beneath a portion of the metal membrane to allow the metal membrane to defect toward the waveguide core. This fabrication method requires an upper cladding material with a refractive index of approximately 1.45 that can be undercut, or removed from underneath selected areas of the metal membrane. Unfortunately, a suitable material is very difficult to develop, and most of the existing low index materials contain fluorine which complicates the deposition and etching of an aluminum metal membrane over the cladding.

The lack of a suitable upper cladding, one which can easily be undercut after an overlaying metal membrane has been deposited, has driven the search for an alternative device design or manufacturing process. One promising solution removes a portion of the oxide upper cladding and replaces it with a planarizing spacer layer which can easily be undercut. The metal membrane is deposited on top of the planarizing spacer layer. After the membrane is deposited, the planarizing spacer layer is removed, leaving the metal membrane suspended over the waveguide. This two material approach does not require an ideal single material, one that has a suitable index of refraction and that easily can be undercut, but instead uses two materials, an oxide cladding layer which provides a suitable index of refraction and a temporary planarizing layer that is easily undercut.

FIGS. 1A through 1G show an optical device according to the present invention during several steps of the fabrication process. In FIG. 1A, a substrate 100, such as a semiconductor wafer, has been prepared, and a lower cladding layer 102, and waveguide core layer 104 deposited on the prepared substrate 100. The lower cladding layer 102 is typically a silicon oxide, while the core layer 104 is typically silicon nitride. The silicon wafer typically has electronic devices fabricated in the surface of the silicon wafer, including electrodes 103 fabricated on the surface of the wafer. The electronic devices are used to control the operation of the optical device.

Figure 1B:
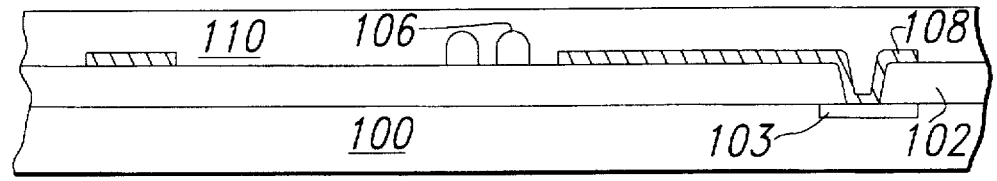
FIG. 1B is a cross section view of the optical device of FIG. 1A showing the upper cladding.

After the core layer 104 is deposited, it can be patterned to form a waveguide. In FIG. 1B, the core layer 104 has been patterned to form two parallel waveguides 106. Although two waveguides 106 are shown in FIG. 1B, any number of waveguides 106 could be used. The waveguides 106 are typically formed close enough together to create crosstalk between the two waveguides 106. After the waveguides have been formed, the wafer 100 is heated to reflow the waveguides 106, giving them a rounded upper surface.

Figure 1C:
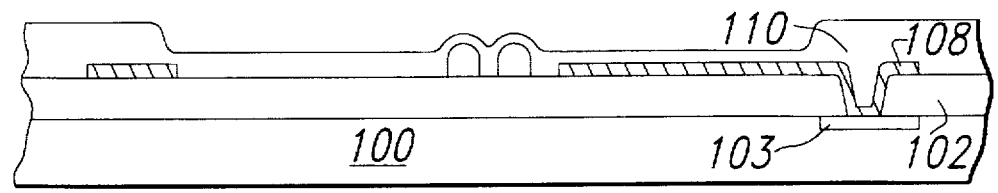
FIG. 1C is a cross section view of the optical device of FIG. 1B after the upper cladding is etched to form a pit.
Figure 1D:
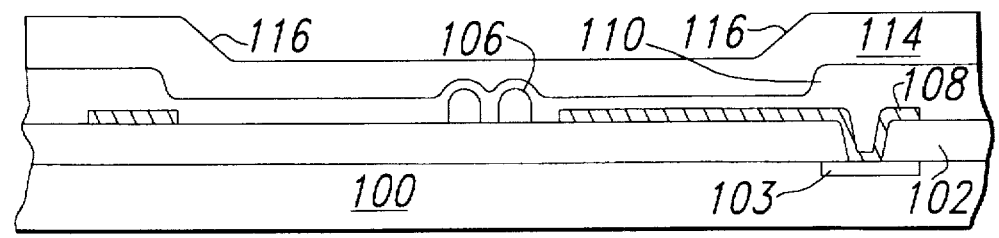
FIG. 1D is a cross section view of the optical device of FIG. 1C after a temporary planarizing spacer has been deposited in the etched pit.
Figure 1E:
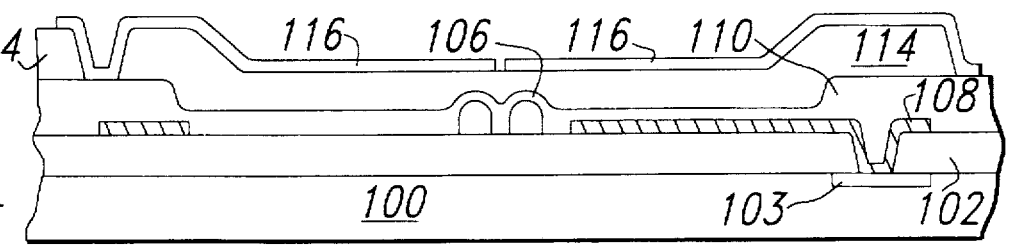
FIG. 1E is a cross section view of the optical device of FIG. 1D after the metal membrane has been formed on the temporary planarizing spacer.
Figure 1F:
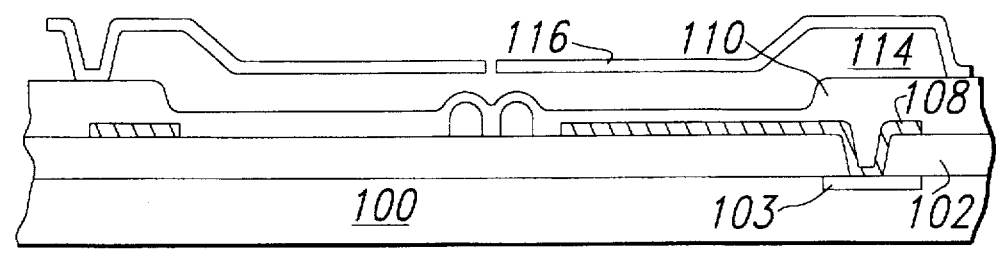
FIG. 1F is a cross section view of the optical device of FIG. 1E after the temporary planarizing spacer has been removed.
Figure 1G:
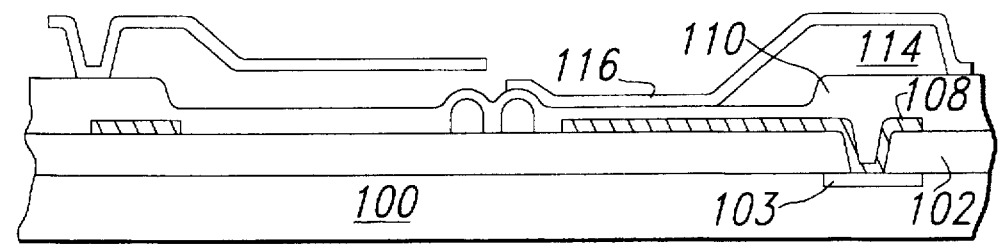
FIG. 1G is a cross section view of the optical device of FIG. 1F showing the deflection of a portion of the metal membrane.
Figure 2A:
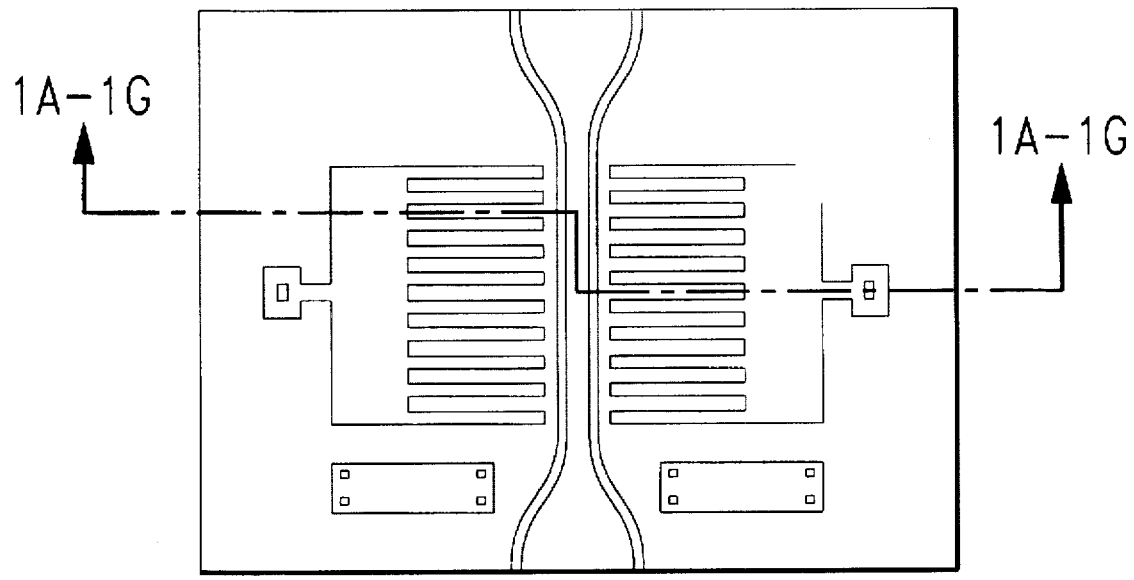
FIG. 2A is a plan view of the optical device of FIG. 1A–1G showing the electrode formed on the lower cladding layer.

A thin metal layer is then deposited on the lower cladding layer 102 near the waveguides 106 and patterned to form electrodes 108. The section plane of FIGS. 1A through 1G passes through each half of the device at a different point, as shown in FIG. 2A. This allows FIGS. 1A through 1G to show as much detail as possible.

The electrodes are typically patterned in a comb shape to allow an insulator to protrude above the electrodes. The insulator prevents the metal membrane, which will be formed later, from contacting the electrodes and short circuiting the device. Although a comb shape is shown, many other configurations may be used. For example, an alternate embodiment has holes formed in the electrodes to allow insulative posts to protrude above the electrodes and separate the electrodes from the deflected metal membrane. Alternatively, the insulative posts are built directly on top of a solid metal electrode.

After the electrodes are formed, an upper cladding layer 110, typically silicon dioxide, is grown on top of the lower cladding 102, waveguides 106, and electrodes 108. As discussed above, this upper cladding layer 110 causes the light passing through the waveguide to be totally internally reflected and also prevents nearby objects from contracting the waveguide core and defeating the total internal reflection.

The upper cladding layer 110 is removed from the region above the electrodes where the metal membrane will deflect. FIG. 1C shows the partially completed device after the upper cladding has been removed, exposing the patterned electrodes 108 and waveguides 106. When the upper cladding 110 is removed, the electrodes 108 may be used to indicate when to stop etching the upper cladding. Ideally, the upper cladding etch is stopped as soon as the bottom of the pit formed in the upper cladding is planar with the top surface of the electrodes 108. The electrodes 108 are then etched back so that the oxide remaining from the upper cladding protrudes between the fingers of the electrode comb. As discussed above, this protrusion prevents the metal membrane from contacting the electrodes 108.

The upper cladding layer 110 is temporarily replaced by a planarizing temporary spacer that can easily be undercut, or etched away. One material that is useful to temporarily replace the upper cladding layer 110 is FUTURREX, a photoresist that is particularly good at planarizing the large steps formed by the removal of the upper cladding layer 110. Any compound that is capable of being applied onto the device in a planar layer, and that can be removed easily will work. Preferably the compound can be spun onto the silicon wafer in a thick layer to planarize the surface. The less photosensitive a compound is, the more likely it will provide a planar surface on which to construct the metal membrane.

Typically 10 to 15 µM of FUTURREX, or another temporary spacer 114, will be spun-on to the wafer over the pit 112. Ideally, the temporary spacer 114 will only fill the pit and have an upper surface that is coplanar with the upper surface of the surrounding upper cladding 110. However, in practice the temporary spacer 114 covers the entire surface of the wafer and has an upper surface above the upper surface of the upper cladding 110 as shown in FIG. 1D. The upper surface of the temporary spacer 114 typically will not be completely planar, but instead will have a sloped region 116 at the edges of the pit 112. These sloped regions 116 are acceptable as long as the region over the waveguides 106 is nearly planar.

After the temporary spacer 114 is applied, it is hardened so that it will remain stable during future processing. The temporary spacer 114 is then patterned to create regions where the metal membrane will be able to mechanically contact the upper cladding layer 110 for support, and electrically contact to electrodes on the wafer 100. Because the ideal temporary spacer materials are not photosensitive, an oxide layer is grown over the temporary spacer and patterned to form a hard etch mask which is used to pattern the temporary spacer material.

Figure 2B:
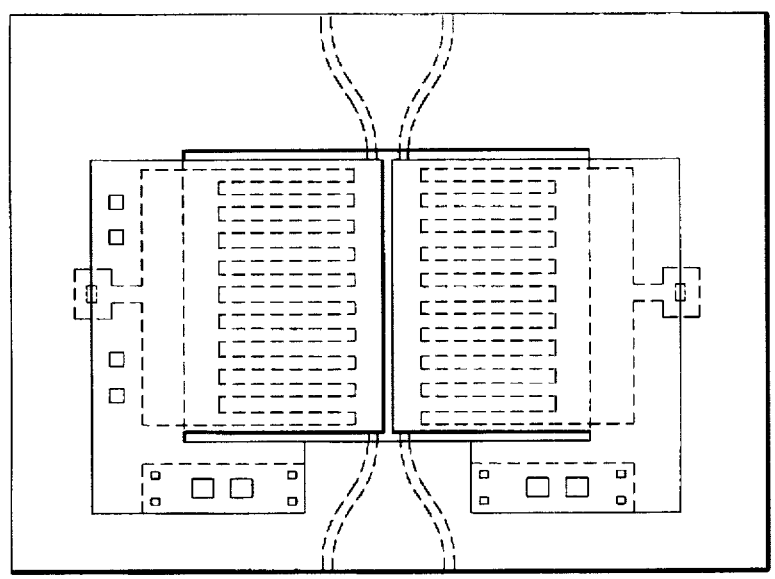
FIG. 2B is a plan view of the optical device of FIG. 1A–1G showing the completed metal membrane.

The mechanical connection between the metal membrane and the upper cladding supports the metal membrane as it is deformed downward against the waveguides 106. According to a first embodiment, the mechanical connection is formed by a series of vias between the metal membrane and the upper cladding as shown in the left half of FIGS. 1E and 2B. An alternative embodiment, shown in the right half of FIGS. 1E and 2B merely deposits the metal membrane beyond the edge of the temporary spacer layer 114, forming a continuous connection between the metal membrane and the upper cladding along two edges of the membrane.

The electrical connections between the metal membrane and the electrodes on the surface of the wafer may be formed directly through the use of a single via, or through intermediate connections between the wafer 100 and the lower cladding 102, the lower cladding 102 and the upper cladding 110, and finally between the upper cladding 110 and the metal membrane.

The choice of electrical connection methods depends on the step coverage of the vias between the layers. If the vias are large enough for the metal from the membrane layer to retain sufficient strength on the sides of the vias, a single via can connect the metal membrane with the electrodes on the surface of the waver. If a structurally sound via between the metal membrane and the wafer surface cannot be constructed, then multiple intermediate vias must be used between the layers. Because of the poor step coverage obtained when depositing metals into vias, most devices will require multiple vias to connect the electrodes on the surface of the wafer to the metal membrane.

After the temporary spacer layer is patterned, a metal layer is deposited over the wafer and patterned to form the metal membrane 116. The metal membrane 116 is typically a 0.5 μM thick layer of aluminum. Once the metal membrane 116 has been formed, the temporary spacer layer is removed leaving the membrane suspended over the exposed waveguides and electrodes as shown in FIG. 1F.

To operate the device, a voltage potential is created between the metal membrane and the electrode at the bottom of the pit. As shown in FIG. 1G, the voltage potential creates an electrostatic force between the membrane and the electrode and causes the membrane to collapse toward the electrode. The raised oxide insulators prevent the membrane from touching the electrode, but allow the membrane to contact the waveguides along most of their exposed length. The contact between the membrane and the waveguide defeats the internal reflection of the waveguide and prevents the propagation of light through the waveguide. To use the device as a switch, light transmitted by a first waveguides is coupled into a second waveguide by the narrow spacing between the two waveguides. The metal membrane associated with the first waveguide is then deflected to attenuate or block the light passing through the first waveguide. The portion of the metal membrane associated with the second waveguide is not deflected, and the light coupled into the second waveguide is allowed to pass though the second waveguide.

Thus, although there has been disclosed to this point a particular embodiment for an optical waveguide device, and a method of fabricating such a device, it is not intended that such specific references be considered as limitations upon the scope of this invention except in-so-far as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims.

What is claimed is:

1. A method of fabricating an optical device, said method comprising:

fabricating a lower cladding layer on a substrate;

fabricating a waveguide on said lower cladding layer;

depositing an upper cladding layer on said lower cladding layer and said waveguide;

removing a portion of said upper cladding layer from a region proximate to said waveguide;

depositing a temporary spacer layer on said waveguide in said region;

depositing a metal layer on said spacer layer;

removing said spacer layer.

2. The method of claim 1 wherein said lower cladding layer is an oxide.

3. The method of claim 1 wherein said upper cladding layer is an oxide.

4. The method of claim 1 wherein said temporary spacer layer is FUTURREX.

5. The method of claim 1 wherein said metal layer is an aluminum alloy.

6. The method of claim 1 further comprising the step of fabricating an electrode layer on said lower cladding layer.

7. An optical device comprising:

a substrate;

a lower cladding supported by said substrate;

at least one electrode on said lower cladding;

a waveguide supported by said lower cladding;

an upper cladding covering a first portion of said waveguide, said upper cladding not covering a second portion of said waveguide;

a metal membrane spaced above said upper cladding and extending over said second portion of said waveguide.

8. The optical device of claim 7 further comprising electronic devices fabricated in the substrate.

9. The optical device of claim 7 wherein said upper cladding is an oxide.

10. The optical device of claim 7 wherein said lower cladding is an oxide.

11. The optical device of claim 7 wherein said waveguide is a nitride.

* * * * *